United States Patent
Mattisson

(10) Patent No.: US 6,184,814 B1
(45) Date of Patent: Feb. 6, 2001

(54) METHOD AND ARRANGEMENT FOR GENERATION OF A TIME MEAN-VALUE FREE BINARY SIGNAL

(75) Inventor: Sven Erik Mattisson, Bjärred (SE)

(73) Assignee: Telefonaktiebolaget L M Ericsson (publ), Stockholm (SE)

(*) Notice: Under 35 U.S.C. 154(b), the term of this patent shall be extended for 0 days.

(21) Appl. No.: 09/113,241

(22) Filed: Jul. 10, 1998

(30) Foreign Application Priority Data

Jul. 14, 1997 (SE) ....................................... 9702705

(51) Int. Cl.$^7$ ............................. H03M 1/12; H03M 3/00
(52) U.S. Cl. ......................................... 341/155; 341/143
(58) Field of Search .................................. 341/143, 155; 375/143, 150, 206, 321; 348/573; 360/46, 77.14

(56) References Cited

U.S. PATENT DOCUMENTS

| | | | |
|---|---|---|---|
| 4,527,075 | 7/1985 | Zbinden | 307/265 |
| 4,963,872 | 10/1990 | Schneider et al. | 341/142 |
| 5,258,879 | * 11/1993 | Shimotashiro et al. | 360/77.14 |
| 5,397,945 | 3/1995 | Shum et al. | 327/77 |
| 5,532,885 | * 7/1996 | Okamura | 360/46 |
| 5,706,000 | * 1/1998 | Fukuzaki et al. | 341/5 |

FOREIGN PATENT DOCUMENTS

0772297 A1   5/1997   (EP).

OTHER PUBLICATIONS

Sayeler, Joni, *PCT International–Type Search Report*, May 25, 1998, Search request No. SE 97/00902, pp. 1–4.

\* cited by examiner

*Primary Examiner*—Patrick Wamsley
(74) *Attorney, Agent, or Firm*—Jenkens & Gilchrist, P.C.

(57) ABSTRACT

The present invention relates to the generation of a time mean value-free binary signal (O) from an input signal (IN). The device (10) comprises a feed-back loop adjusting the pulse ratio of the output signal by comparing its mean value to the mean value of a time mean value-free reference signal (J) and feeding-back the difference between said two mean values. The mean values are approximated by low pass filtering the binary signal (O) and the reference signal (J) with two filters (8, 7). If the filters (8, 7) are non-linear, the mean values of the filtered signals (S, FJ) can deviate from the mean values of the reference signal (O) and the reference signal (J). By constructing the filters (8, 7) as regards non-linearities, to be equal, the aforementioned discrepancy will be compensated, since the signals will deviate to the same degree from their theoretical values, when time mean value free.

17 Claims, 5 Drawing Sheets

METHOD AND ARRANGEMENT FOR GENERATION OF A TIME MEAN-VALUE FREE BINARY SIGNAL

TECHNICAL FIELD

The invention relates to a device and a method for generating a time mean value-free binary signal from an input signal.

STATE OF THE ART

The object of a limiter is to divide the continuous voltage area of an analog input signal into two regions and to generate a digital output signal indicating in which of these two regions the analog signal is located. The digital output signal must per definition have an extremely short transition time. Thus, a limiter can alternatively be regarded as a bold amplifier, since a slowly varying input signal results in an output signal with very fast switching.

By digital signal in this context is meant a signal, which substantially only can have one of two binary signal levels and where the switching time between these two levels is negligible. Thus, the input signal being analogue means that the input signal does not fulfil the two above mentioned criterias. Nevertheless, the information which the signal contains can very well be of digital type. For example, the analog input signal can be a data signal in a receiver based on a transmitted digital signal which at the transfer has been distorted and/or superimposed with noise. By suitable limitation of the data signal, an estimation of the transmitted signal is obtained. However, herein it is important that the division line between said two regions mentioned above is on the right level for correct supply of high or low level to the digital output signal.

Transmitted data signals are normally so coded that the signal reaches a high level during substantially 50% of the time. Such signals that fulfil this criterion can be said to be time mean value free. The mean value freedom of an analog signal is normally defined by the direct voltage component being zero, which means that the area above the zero line is equal to the area below thereof. The mean value freedom of a binary signal can be defined in different ways. However, in the following a binary signal is time mean value-free when the DC component of the binary signal is between the two signal levels which the binary signal can have.

Another example of situations where a time mean value-free binary signal is aimed at is when, starting from a repetitive signal one wishes to generate a clock signal, for instance for synchronization purposes, where the clock signal shall show a pulse ratio of 50% and have the same frequency as the repetitive signal.

Such a binarization of an analog signal is often used in a totally digital environment. A circuit for generation of a time mean value-free binary clock signal from an analog input signal can often be the only circuit of analog type in an application having mostly digital character. Consequently, it would be desirable to be able to realize this analog circuit in the same digital process. The possibility of employing MOS field effect transistors for realization of resistors and capacitors and be able to produce a circuit of analog type in a digital CMOS process is already well known. One problem herein is that the resistors and capacitors thereby obtained hardly can obtain any higher precision in their component values. Furthermore, it is problematical to realize analog components with sufficient linearity. Capacitors and high-resistive resistors, linear over a greater voltage range, can hardly be obtained with this technology. For CMOS-circuits, capacitors with higher linearity are achieved by using two polysilicon layers for the capacitor plates consisting of the input capacitance of the transistor at the gate. However, standard-CMOS-processes employed in integrated digital circuits do not use such polysilicon layers. An alternative method for obtaining capacitors with higher linearity is to use polysilicon/metal or metal/metal capacitors. However, since the distance between a polysilicon layer and a metal layer or a metal layer and another metal layer is much higher than between two polysilicon layers, the area of these capacitors is often ten times larger.

U.S. Pat. No. 4,963,872 presents a binarizing circuit for generation of a mean value-free binary signal employing a feedback, wherein the binarized signal is compared to a time mean value-free binary reference signal generated by means of a frequency divider, said reference signal having the same signal levels as the binarized signal. The reference signal is low pass filtered so powerfully that the signal after the filtration is considered to correspond to the mean value of the reference signal, whereafter said filtered signal is subtracted from the binarized signal. The signal thereby obtained is integrated with an analog integrator and fed back to the input of the circuit, where it is subtracted from the analog input signal. The binarized signal is then obtained by the result being compared to a fast threshold value, in such a way that the binarized signal reaches a high level if the corrected input signal exceeds the threshold value, and a low level if it is below the threshold value. Hereby, the feedback loop will be adjusted in such a way that the mean value of the binarized signal reaches the same value as the reference signal. Since the reference signal is time mean value-free, the binarized signal will consequently also be almost time mean value-free.

However, the disclosed circuit requires linear components. Non-linear components cause deviations from the theoretical result so that a remaining error in the binarized output signal will be obtained. Therefore, the circuit is hard to implement in a digital CMOS technology.

SUMMARY OF THE INVENTION

When binarizing an incoming analog signal it is, as mentioned above, desirable to be able to obtain a time mean value-free binary signal without requiring absolute linearity of the components comprised in the circuit. The object of the present invention is to solve the above mentioned problem.

The problem is solved by generating a binary signal in a feedback loop from an input signal. This signal, which can also be the output signal of the circuit, is lowpass-filtered with a first filter, whereafter it is compared to a time mean value-free reference signal while forming a difference signal, which reference signal is lowpass-filtered with a second filter. The difference signal thereby obtained is fed back to the input of the circuit. The first and the second filter are substantially identical as regards possible non-linearities in the characteristic of the filters. Hereby, possible deviations from time mean value-freedom in the time mean value of the generated binary signal are minimized.

The generated binary signal, being the output signal of the circuit, is advantageously generated by means of a limiter which binarizes the input signal. For generation of a square wave-shaped clock signal alternatively a pulse generator triggered by the input signal can be employed.

By comparing the mean value of the output signal to a mean value of a time mean value-free reference signal, a measure of the deviation of the output signal from time mean value-freedom can be obtained. By feedback of this deviation, a feedback loop is obtained striving to be adjusted so that the difference between the mean value of the output signal and the mean value of the reference signal is minimized.

According to the present invention the comparison between the mean value of the output signal and the time mean value-free reference signal is realized by the output signal being filtered through a first lowpass filter with a low cut-off frequency compared to the input signal. Hereby, a first filtered signal is obtained. Due to non-linearity in the filter used, the mean value of the signal can differ from the mean value of the output signal. By generating a time mean value-free signal and filtering the signal through a second lowpass filter, which with respect to non-linearities is substantially identical to the first lowpass filter, a second filtered signal is obtained of which the mean value due to non-linearities does not differ from the mean value of the reference signal. The direct current level of the second filtered signal will deviate from the ideal value substantially as much as the direct current level of said first filtered signal differs from its ideal value, when the output signal reaches a high level during 50% of the time. Consequently, possible deviations due to non-linearities tend to eliminate each other, and therefore the output signal will substantially obtain the same direct voltage level as the reference signal, and time mean value-freedom will be obtained.

Thus, the object of the present invention is to provide a device and a method for generating a time mean value-free binary signal from an input signal, in which absolute linearity of the components comprised in the circuit is not required.

An important advantage of the invention is the production of a device and a method for generating a time mean value-free binary signal from an input signal, in which the device as a whole can be made as an integrated circuit with full VLSI compatibility without additional components.

Another advantage of the present invention is the creation of a device and a method for generating a time mean value-free binary signal from an input signal, in which the device is suitable for realization in a digital CMOS-process.

A further advantage of the present invention is the creation of a device and a method for generating a time mean value-free binary signal from an input signal with an arbitrary high bandwidth. The invention is also excellent for high bandwidths up to several gigabytes per second.

The invention will be explained in more detail below by means of examples with reference to the enclosed drawing.

DETAILED DESCRIPTION OF PREFERRED EMBODIMENTS

Figure 1:
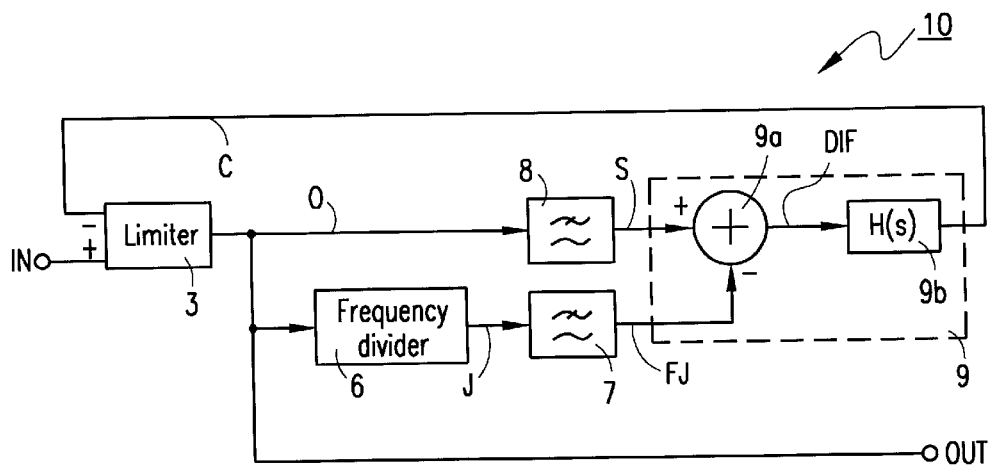
FIG. 1 is a block diagram of a general embodiment of the present invention.

FIG. 1 illustrates a schematic block diagram for a first embodiment of a device 10 for generating a time mean value-free binary signal according to the present invention.

A limiter 3 with an output and a positive and a negative input is provided on the positive input of an input signal IN. The output of the limiter is connected to the input of a frequency divider 6 as well as to the input of a first filter 8. The output of the frequency divider 6 is connected to the input of a second filter 7. The output of the first filter and the output of the second filter are each connected to an input of a regulator 9. At the output of the regulator 9 a control signal C is obtained, which is fed back to the negative input of the limiter 3.

The regulator 9 comprises a difference signal former 9a and a control signal former 9b, which are so arranged that the output of the difference signal former 9a is connected to the input of the control signal former 9b. The difference signal former has a positive and a negative input which are connected to the inputs of the regulator in such a way that the first filter 8 is connected to the positive input of the regulator and the second filter 7 is connected to the negative input of the regulator.

The object of the limiter 3 is to divide the continuous voltage range of the input signal in two regions and to generate a binary signal O which indicates within which of these regions the input signal is located. The binary signal O is supplied to the input of the frequency divider 6, which on its output generates a reference signal J, which is time mean value-free. The binary signal O is supplied to the first filter 8, which mainly is of low-pass type. Hereby a first filtered signal S is generated. Correspondingly, the reference signal J is supplied to said second filter 7 which also has mainly low-pass characteristic. Hereby a second filtered signal FJ is generated. The regulator 9 is hereby brought to generate—outgoing from the filtered signals S and FJ—a control signal C, which is supplied to the negative input of the limiter 3. In this way a feedback is achieved. When there is a negative feedback, the feedback loop will be adjusted so that the difference between the two filtered signals S and FJ is minimized.

The limiter 3 can, if desired, be provided with hysteresis. By using such a hysteresis for the trigger level of the limiter so that the threshold value for triggering from high to low level differs somewhat from the threshold value for triggering from low to high level, false flanks created by noise in the binary signal O can be decreased.

The difference signal former 9a subtracts, under formation of a difference signal DIF, the second filtered signal FJ from the first filtered signal S. The control signal former 9b, to which the difference signal DIF is connected, is provided to generate the control signal C from the difference signal DIF, wherein the transfer function of the control signal former 9b from the difference signal to the control signal is characterized in that:

$$H(s) \approx \frac{s \cdot k_1 + k_2}{s},$$

where H(s) represents the transfer function of the control signal former, $k_1$ represents a first constant, $k_2$ represents a second constant, and s represents the Laplace transform. The values of the first constant $k_1$ and of the second constant $k_2$ are greater or less or equal to zero.

Figure 2:
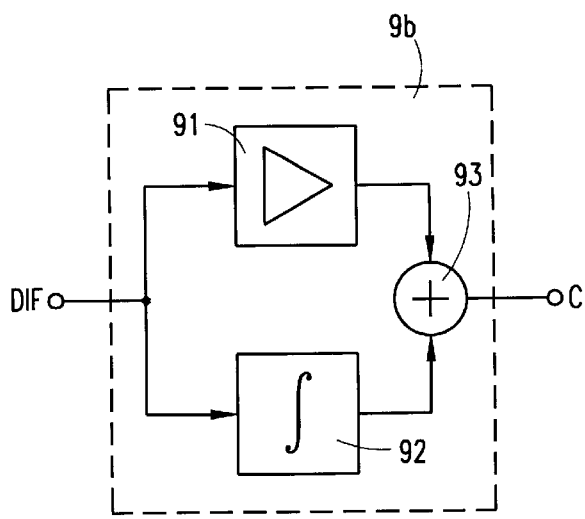
FIG. 2 is a block diagram illustrating the function of a regulator comprised in the embodiment illustrated in FIG. 1.

The control signal former 9b is further illustrated in FIG. 2. The control signal former comprises an integrator 92, an amplifier 91 and an adder 93. The difference signal DIF is supplied to the input of the amplifier and to the input of the integrator. The adder 93 thereafter forms the control signal C from the signal of the output of the amplifier 91 and the signal of the output of the integrator 92. This disclosed realization of the regulator 9 and the control signal former 9b is solely to be considered as an example. Normally, a regulator is chosen having either a purely integrating function, wherein the amplifier 91 is not present, or a purely proportional function, wherein the integrator 92 is not present. In both cases, also the requirement of the adder 93 is eliminated. Furthermore it is fully possible, with prior art, to select another type of regulator, such as for example a regulator containing a derivative part.

At negative feedback, the feedback loop will be adjusted so that the difference signal DIF as an average-value adopts the value zero.

Figure 3:
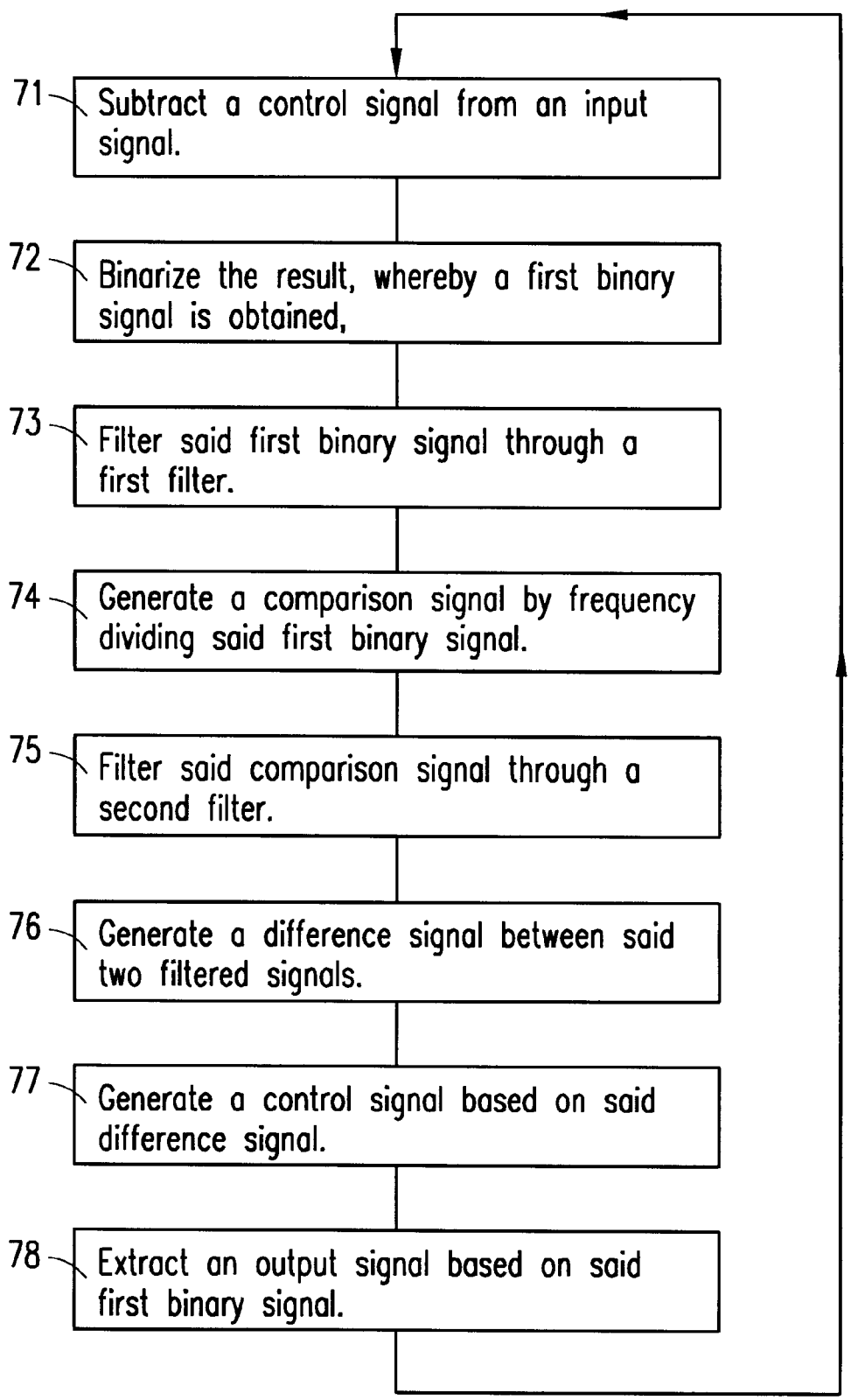
FIG. 3 is a flow chart for the embodiment in FIG. 1.

FIG. 3 shows a flow chart for the embodiment disclosed with reference to FIG. 1. In a step 71 the limiter is brought to subtract the control signal from the input signal. The result is binarized by the limiter in a step 72, wherein a first binary signal is generated. The first binary signal is filtered in a step 73 through the first low-pass filter, in which the cut-off frequency is low compared to the frequency of the binary signal.

In a step 74 the first binary signal is frequency divided. Hereby, the reference signal is obtained, which is always time mean value-free. This reference signal is filtered in a step 75 through the parallel with the first filter arranged second low-pass filter, the cut-off frequency of which being low relative to the frequency of the reference signal. The two low-pass filters are equal as regards non-linearities.

By means of the regulator a difference signal between the two filtered signals is created in one step 76. From this difference signal the above mentioned control signal is generated in one step 77. The regulator in this example is a PI-regulator but other types of regulators are conceivable in this connection. Regulator and regulator parameters should be selected in a common way of the controlling technology with respect to stability and dynamic and static control errors.

The feedback loop obtained by this method strives to adjust the binarized signal so that its time mean value becomes 50%. Hereby, the wanted time mean value-free output signal is obtained. This is illustrated in a step 78.

Figure 4:
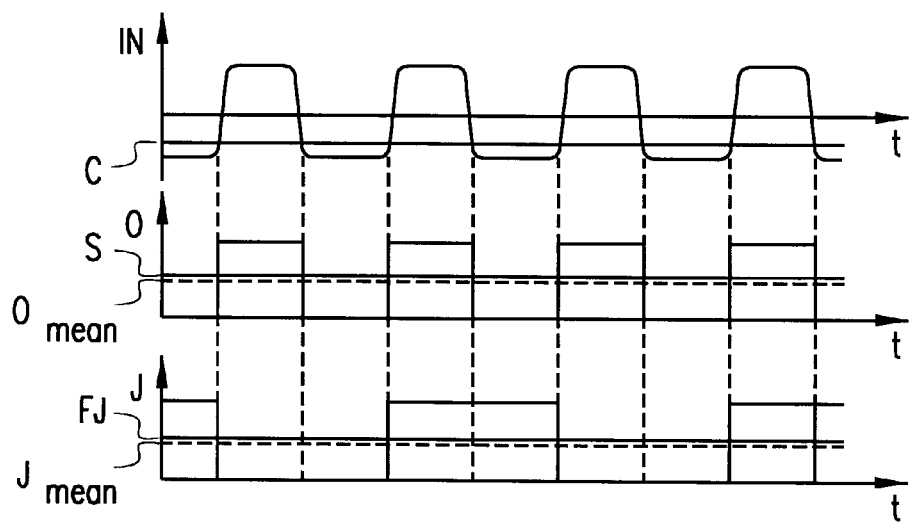
FIG. 4 shows signal diagrams illustrating the function of the invention.

FIG. 4 shows a signal diagram in which t represents the time and which illustrates the function of the invention starting from the embodiment illustrated in FIG. 1 and FIG. 3. In the example illustrating the signal diagram, the regulator 9 has an integrating part, i.e. the above mentioned first constant $k_1$ differs from zero.

The input signal IN is here approximately square-wave formed with a pulse ratio of below 50%, i.e. the signal has a low level for a somewhat greater time share than it has at a high level. In the same diagram which shows the input signal IN, also the control signal C is shown. The limiter represented by 3 in FIG. 1, compares the input signal IN with the control signal C. Hereby the limiter gives a high level out if the value of the input signal IN is higher than the value of the control signal C, and a low level out if the value of the input signal IN is lower than the value of the control signal C. In this way the binary signal O is obtained, as shown in the Figure. In the position shown in this FIG. 4, the feedback loop has adjusted the value of the control signal C so that the binary signal O, and thus the output signal OUT, is time mean value-free and the feedback loop is in equilibrium. The mean value $O_{mean}$ of the binary signal O is at time mean value-freedom right between high and low level for the binary signal O.

Based on the binary signal O the reference signal J is generated by frequency splitting. The reference signal is always time mean value-free so that its mean value $J_{mean}$ consequently is right between high and low level for the reference signal J. Since the signal levels of the binary signal O and the reference signal J are identical, the difference between the mean value $O_{mean}$ of the binary signal O and the mean value $J_{mean}$ of the reference signal is constantly zero. This corresponds to the theoretical relationship for the two filtered signals S and FJ at linear filters. However, the filters are not completely linear. Non-linearities in the filter 8, which filters the binary signal O, can imply that the mean value of the first filtered signal S deviates from the mean value $O_{mean}$ of the binary signal O. This is also the case in this example, as illustrated in the Figure. However, the filters 7 and 8 are equal as regards non-linearities. In this example this has been achieved by the fact that the two filters 7 and 8 have essentially completely identical filter components. This results in the mean value of the second filtered signal FJ deviating as much from the mean value $J_{mean}$ of the reference signal J as the mean value of the first filtered signal S deviates from the mean value $O_{mean}$ of the binary signal O.

The input signal IN is in this FIG. 4 a repetitive signal. However, it could also be a data signal with substantially 50% probability for high level.

Figure 5:
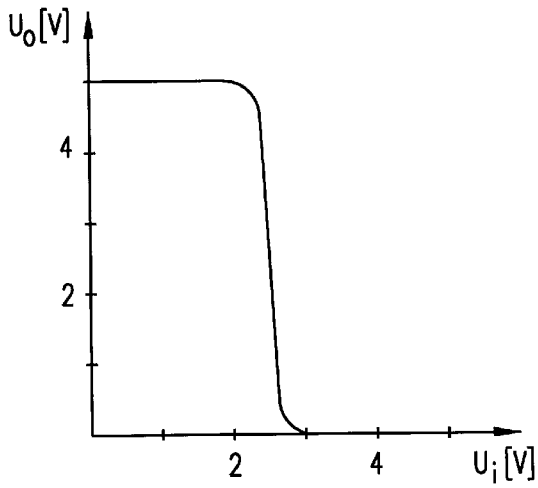
FIG. 5 is a diagram illustrating the transfer function of a CMOS inverter.

FIG. 5 shows the relation between the voltages of the input and output of a CMOS inverter constructed according to the prior art. $U_i$ in this case represents the voltage of the input of the CMOS inverter; $U_o$ represents the voltage of the output of the CMOS inverter, and V represents the unit Volt. The object of a CMOS inverter is to provide a low level out if the voltage $U_i$ of the input is high, and a high level out if the voltage $U_i$ of the input is low. Consequently, the inverter, as is also illustrated in this FIG. 5, can be considered as a limiter. However, the CMOS inverter has a for a limiter wide transfer area. However, by series-connecting a number of CMOS-inverters, a limiter can be obtained, the transfer area of which is considerably diminished relative to the characteristics of a particular CMOS inverter. Hereby, a limiter with very simple construction is obtained very well suited for implementation in a digital CMOS process.

Figure 6:
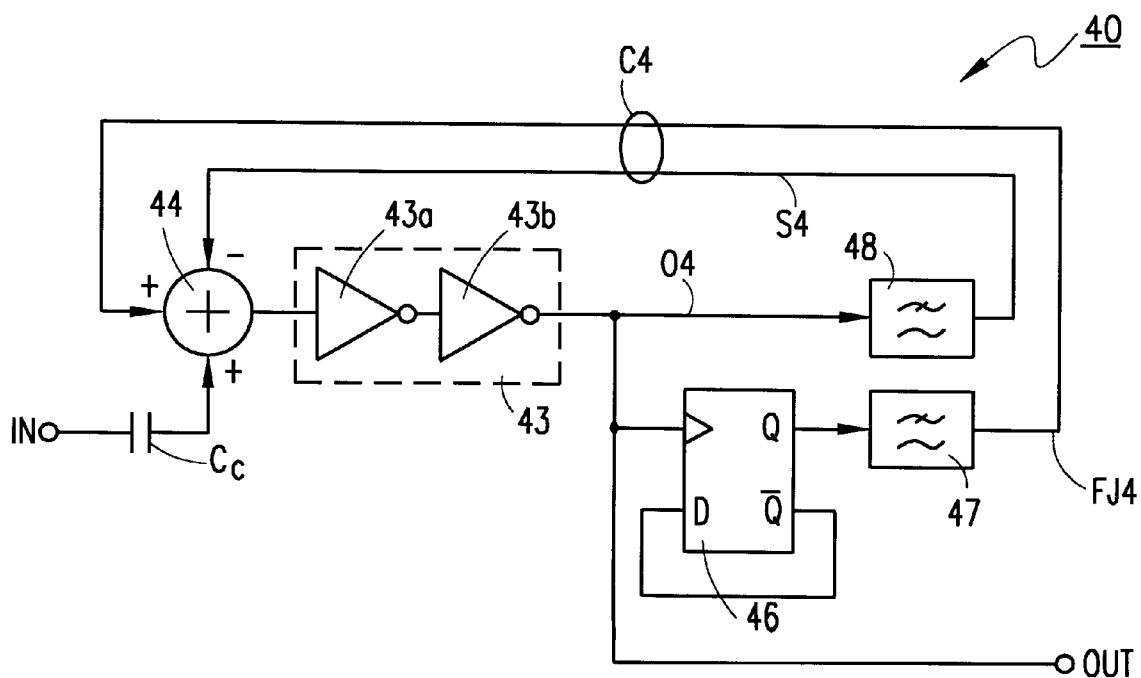
FIG. 6 is a wiring diagram illustrating an embodiment of the present invention well suited for implementation in digital CMOS technology.

FIG. 6 shows a block diagram of a further embodiment of a device 40 for generating a time mean value-free binary signal according to the present invention. Hereby a limiter constructed of a CMOS inverter is used, as discussed in connection to FIG. 5. In the device 40 an input signal IN is connected, via a connection capacitor $C_c$ and an adder 44, to a limiter 43, which comprises a first CMOS inverter 43a and a second CMOS inverter 43b connected in series, where the input of the first CMOS inverter 43a is the input of the limiter, and the output of the second inverter 43b is the output of the limiter. The limiter generates a binary signal O4 in such a way that this binary signal O4 adopts a high level when the voltage of the input of the limiter exceeds a threshold level, and a low level when the voltage is below the threshold level. The threshold level is substantially right between the high and low levels of the output signal.

Based on the binary signal O4 a frequency divider 46, which in this case is a D flip-flop, generates a reference signal J4. The D flip-flop is according to the prior art arranged, at its positive output, to generate a time mean value-free signal, the frequency of which being half as high as the frequency of the signal at the clock input of the D flip-flop. Since this latter signal consists of the binary signal O4, the frequency divider 46 is in this way brought to generate the reference signal J4, which is time mean value-free and has a frequency half as high as the frequency of the binary signal O4.

The binary signal O4 is also supplied to a first low-pass filter 48, in which the cut-off frequency is very low in relation to the frequency of the reference signal and generating a first filtered signal S4. This signal S4 is connected to a negative input of the adder 44.

The reference signal J4 is supplied to a second low-pass filter 47, in which the characteristic is substantially identical to the characteristic of the first low-pass filter 48. The low-pass filter 47 generates a second filtered signal FJ4. This signal FJ4 is connected to a positive input on the adder 44.

The two filtered signals FJ4 and S4 are so powerfully filtered that they, if the low-pass filters 47 and 48 are linear, can be considered to substantially correspond to the mean values of the reference signal J4 and the binary signal O4, respectively.

Instead of seeing the first filtered signal S4 and the second filtered signal FJ4 as two separate signals subtracted from, and added to, the input signal IN, an equivalent view of the first filtered signal S4 and the second filtered signal FJ4 together constitute a differential control signal C4, which signal is fed back to the input of the limiter 43, where it is subtracted from the input signal IN by the adder 44.

By the feed-back of the differential control signal C4 to the adder 44 a feed-back loop is obtained, intending to minimize the value of the control signal C4. Since the filters 47 and 48 as regards non-linearities are totally identical this also implies that the time mean value of the first binary signal O4 is adjusted to the time mean value of the reference signal J4 independent of possible non-linearities of the filters 47 and 48. Since the reference signal J4 is time mean value free, the feed-back loop tries to adjust until the first binary signal O4 becomes time mean value free. The binary signal O4 constitutes the output signal OUT.

Figure 7:
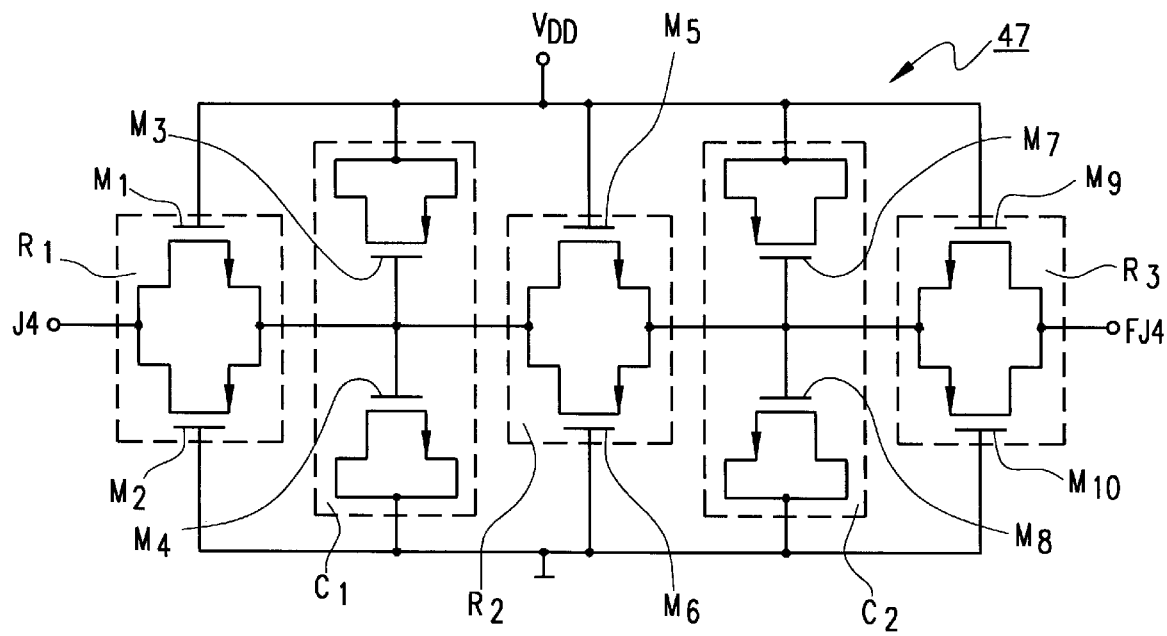
FIG. 7 is a wiring diagram of an embodiment of a filter of the embodiment illustrated in FIG. 6.

FIG. 7 illustrates an embodiment of the low-pass filter of the embodiment illustrated in FIG. 6. The low pass filter 47, which is very suitable for implementation in digital CMOS technology, is a two link passive filter consisting of resistances and capacitances according to prior art, where the resistances and capacitances each include a complementary MOS transistor pair which includes an a NMOS transistor (MOSFET with positively doped substrate) and a PMOS transistor (MOSFET with negatively doped substrate).

An NMOS transistor M1 and a PMOS transistor M2 are parallel arranged so both collectors and both of the emitters are coupled together. The gate of the transistor M1 is connected to a power supply VDD and the gate of the transistor M2 is connected to ground. Hereby, a resistance R1 is obtained between the collectors and emitters of the transistors M1, M2. By the complementary procedure for the resistance R1, a greater area is obtained compared to only one transistor. The connected collectors of the transistors M1 and M2 are herein connected to the input of the filter, to which the reference signal J4 is connected. To the joined emitters of the transistors M1 and M2 a capacitance C1 is connected to signal ground. The capacitance C1 consists of the parallel coupled barring layer capacitances of an NMOS transistor M3 and a PMOS transistor M4. Herein the collector and emitter of the transistor M3 are both connected to the power supply VDD, and the collector and emitter of the transistor M4 are both connected to ground. The gates of the transistors M3 and M4 are connected to the emitters of the transistors M1 and M2. Hereby, the resistance R1 and the capacitance C1 form a first passive low-pass link. The link is loaded by a totally equivalent constructed second low pass link consisting of a resistance R2 and a capacitance C2, which resistance R2 consists of an NMOS transistor M5 and a PMOS transistor M6 and the capacitance C2 consists of an NMOS transistor M7 and a PMOS transistor M8.

The second low pass link is followed by a resistance R3, which corresponds to the resistances R1 and R2 and is realized by a parallel connection of an NMOS transistor M9 and a PMOS transistor M10. The emitters of the transistors M9, M10 are connected to the output of the low pass filter 47, in which the second filtered signal FJ4 is obtained.

The resistances R1 and R2 and the capcitances C1 and C2 are so arranged that the low pass filter 47 has such a low cut-off frequency in relation to the frequency of the reference signal J4 that the second filtered signal FJ4 cam be seen as a direct voltage with possible overlapping ripple. If the resistances would be ideal, i.e., totally linear, the direct voltage would correspond to the mean value of the reference signal J4, which is in between high and low levels of the reference signal J4, since the reference signal J4 has a pulse ratio of 50%. However, if the components of the low pass filter are non-linear, the direct voltage level of the second filtered signal Fj4 can deviate from the mean value of the reference signal J4. However, as is disclosed above the deviation will be compensated by the two parallel arranged filters 47, 48 being equal as regards non-linearities, so the first filtered signal S4 at the time mean value is considered to deviate as much from the time mean value of the binary signal O4 from the limiter as the second filtered signal FJ4 deviates from the mean value of the reference signal J4.

In all disclosed examples, the reference signal is generated from the signal of the limiter. However, an internally generated signal or substantially any signal, can fulfill the same function as the binary signal of the limiter in this aspect, if the signal has regular flanks, to which a frequency divider can trig. Regular flanks are regarded such that the position of the flanks must not only show any periodicity, but must approach sufficiently often for the frequency of the signal to be regarded as high compared to the cut-off frequency of the low pass filter.

Figure 8:
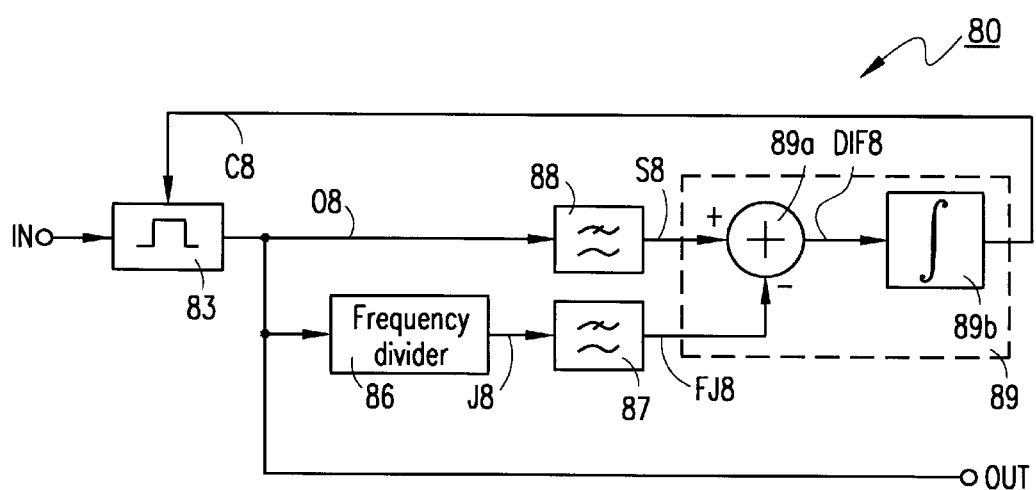
FIG. 8 is a block diagram of an embodiment of the present invention for generating a time mean value-free clock signal.

In FIG. 8 is illustrated a block diagram of a device 80 for generating a time mean value free clock signal according to the present invention. The embodiment of the invention generates a time mean value-free repetitive square pulse formed output signal OUT in form of repetitive binary pulses, based on a repetitive input signal IN. The input signal IN can for instance come from a clock generator, in which the output signal is not totally time mean value-free.

The input signal IN is supplied to the input of a pulse generator 83 in the form of a monostable flip-flop. The output of the monostable flip-flop is connected to the input of a frequency divider 86 and the input of a first filter 88. The output of the frequency divider 86 is connected to the input of a second filter 87. The output of the first filter 88 and the output of the second filter 87 are each connected to an input of a regulator 89. On the output of the regulator 89, control signal C8 is obtained, which is fed-back to a gate input of the pulse generator 83.

The regulator 89 comprises a difference former 89a and an integrator 89b, arranged so the output of the difference former 89a is connected to the input of the integrator 89b. The difference former has a positive and a negative input, connected to the inputs of the regulator in such a way that the first filter 88 is connected to the positive input and the second filter 87 is connected to the negative input.

The pulse generator 83 in form of the monostable flip-flop generates a binary signal on its output O8. The monostable flip-flop is in this example of the type that it is only affected by positive flanks of the input signal (IN). For each positive flank of the input signal IN a positive pulse is generated.

The pulse length is controlled as usual by monostable flip-flops of charge and/or discharge of a capacitance. The capacitance is charged by means of a voltage supplied by an RC-link. For monostable flip-flops with set pulse length, the voltage consists normally of a set reference voltage, such as for instance the power supply to device. In this embodiment the voltage consists of the control signal C8. In this way a controllable pulse length is obtained.

The frequency divider 86 generates a reference signal J8 by frequency dividing the binary signal O8. As long as the binary signal O8 includes regular pulses, the reference signal J8 always becomes time mean value free. Thus as reference signal has the same signal levels as the binary signal O8, the mean value of the reference signal is in the middle of high and low levels of the binary signal O8.

The first filter 88 generates by low pass filtering with low cut-off frequency a first filtered signal S8. In the same way, the second filter 87 generates a second filtered signal FJ8. Both of the filtered signals S8 and FJ8 are subtracted by the difference signal former 89a when generating a difference signal DIF8. The signal DIF8 is integrated by the integrator 89b, wherein the control signal C8 is obtained.

As disclosed the control signal C8 is fed-back to the pulse generator 83. If the mean value of the difference signal DIF8 is positive, the value of the control signal C8 increases. Hereby, the capacitance of the monostable flip-flop will be charged faster, wherein the pulse length is shorted and the mean value of the binary signal O8 is lowered. Hereby follows that also the mean value of the difference signal DIF8 is lowered, implying negative feedback. The thereby obtained feedback loop is considered to, due to the negative feedback, adjust such that the average value of the difference signal DIF8 is zero. This implies that the binary signal O8 adjusts to the reference signal J8.

If both filters 87 and 88 are linear this further implies that the binary signal O8 is considered to have the same mean value as the reference signal J8, implying time mean value freedom. The binary signal O8 is taken out as the output signal of the circuit OUT.

However, herein, both filters 87 and 88 are non-linear. As discussed above, the non-linearity of a filter can imply that the mean value of the output signal of the filter can deviate from the mean value of its output signal. By the non-linearity of the filters, the function of the device 80 can hereby be adventured by resetting the difference signal DIF8 such that the binary signal O8 obtains the same mean value as the reference signal J8. However, the filters 7 and 8 are realized so that they are equal as regards non-linearities. This implies that the mean value of the second filtered signal FJ8 deviates as much from the mean value of the reference signal as the mean value of the first filtered signal S8 deviates from the mean value of the binary signal O8.

Hereby, the non-linearities in both filters are considered to wipe out each other, guaranteeing that the device 80 always goes to time mean-value freedom of the output signal OUT.

Figure 9:
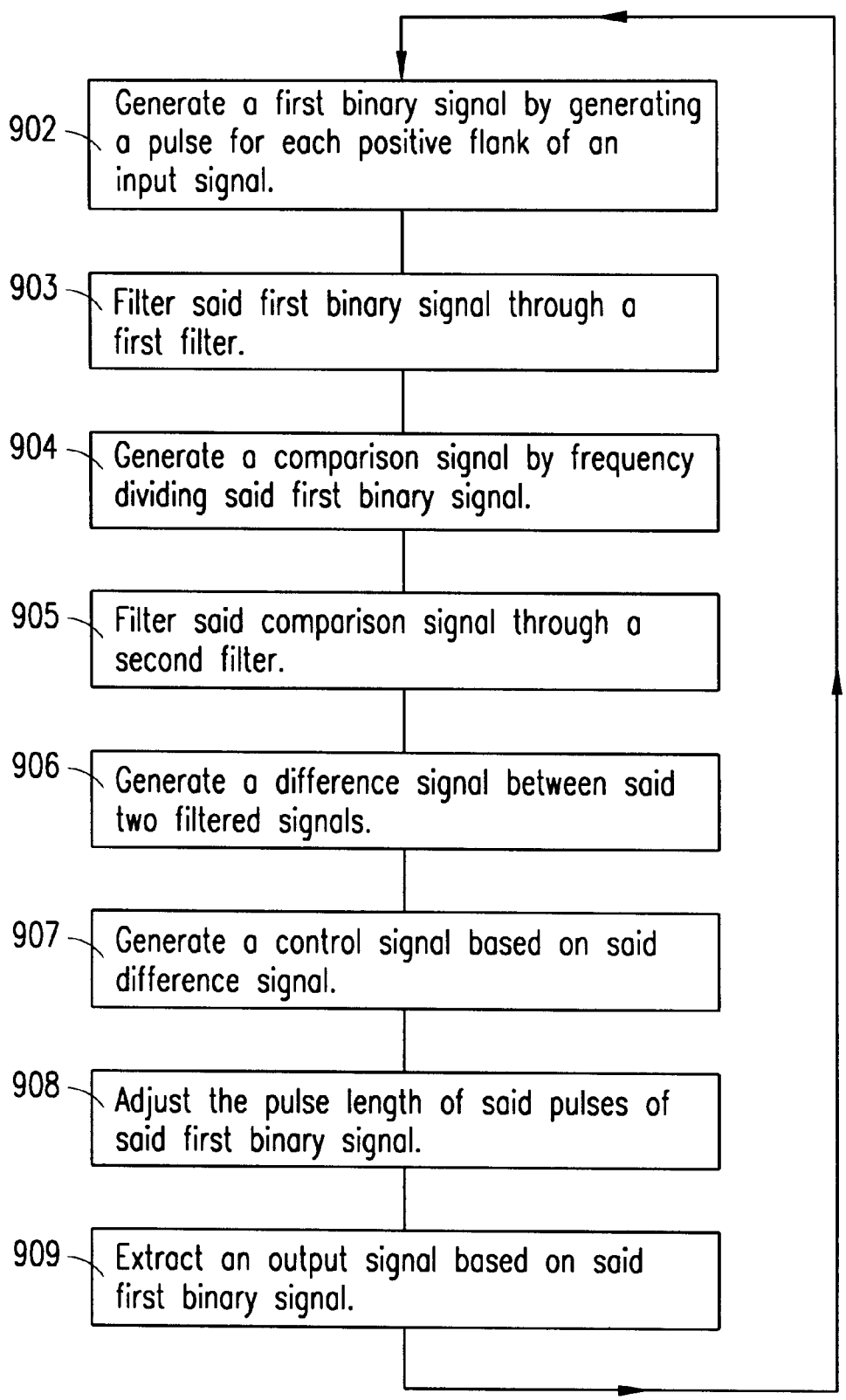
FIG. 9 is a flow chart for the embodiment in FIG. 8.

In FIG. 9 is shown a flow chart for the embodiment disclosed in connection to FIG. 8. In a step 902, the first binary signal is generated from the periodical input signal. The pulse generator is hereby trigged of positive flanks on the input signal, wherein a positive pulse of the binary signal is generated for each positive flank of the input signal, wherein a positive flank of the binary signal is generated for each positive flank of the input signal.

The obtained first binary signal is filtered in a step 903 through the first low pass filter, in which the cut-off frequency is low compared to the frequency of the binary signal.

In a step 904 the first binary signal is frequency divided. Hereby, the reference signal J8 is obtained, which is always time mean value free. The reference signal is filtered in a step 905 through the parallel to the first filter arranged second low pass filter, in which the cut-off frequency is low compared to the frequency of the reference signal. Both low pass filters are equal as regards non-linearities.

By using a regulator in a step 906 is formed a difference signal between both of the filtered signals. Based of the difference signal, the regulator generates the control signal C8 in a step 907. The control signal is fed back in one step 908 to the pulse generator, in which it controls the pulse length of the generated pulses of the first binary signal.

The feedback loop of the method strives to adjust the binarized signal so its pulse ratio becomes fifty percent. Hereby, the required time mean value free output signal is obtained. This is illustrated in a step 909.

What is claimed is:

1. A method for generating a time mean value-free binary signal (OUT) from an input signal (IN), comprising the steps of:

generating a first binary signal (O, O4) from an input signal and a control signal;

filtering the first binary signal (O, O4) through a first filter (8, 48) with substantially low pass characteristic, generating a first filtered signal (S, S4);

filtering a time mean value-free reference signal (J, J4) through a second filter (7, 47) with substantially low pass characteristic, generating a second filtered signal (FJ, FJ4); and generating the control signal (C, C4) based on a difference signal between the first filtered signal (S, S4) and the second filtered signal (FJ, FJ4), said control signal being substantially proportional to the sum of the difference signal multiplied by a first constant and a second constant multiplied by the integral of said difference signal;

wherein the first filter (8, 48) and said second filter (7, 47) are substantially equal, and said time mean value-free binary signal (OUT) is constituted of said first binary signal (O, O4).

2. The method of claim 1, wherein said first binary signal (O, O4) is generated in a limiter (3) triggered by the input signal (IN), wherein the limiter (3) performs the step of subtracting.

3. The method of claim 1, wherein the input signal (IN) is analog.

4. The method of claim 1, wherein said second constant is zero, said control signal (C, C4) being substantially proportional to the difference between said first filtered signal (S, S4) and said second difference signal (FJ, FJ4).

5. The method of claim 1, wherein said step of generating said control signal (C, C4) is performed by integrating said difference signal, said difference signal being substantially proportional to the difference between said first filtered signal (S, S4) and said second filtered signal (FJ, FJ4).

6. The method of claim 1, further comprising, before said step of filtering the time mean value-free reference signal, the step of:

generating said time mean value-free reference signal (J, J4) by frequency dividing a second binary signal with regular flanks.

7. The method of claim 1, further comprising, before said step of filtering said time mean value-free reference signal, the step of:

generating said time mean value-free reference signal (J, J4) by frequency dividing said first binary signal (O, O4).

8. The method of claim 1, wherein the signal levels of said time mean value-free reference signal (J, J4) are substantially identical to the signal levels of said first binary signal (O, O4).

9. The method of claim 1, wherein the cut-off frequency of said first filter (8, 48) and the cut-off frequency of said second filter (7, 47) are both low in relation to the frequency of said input signal (IN).

10. A device (10, 40) for generating a time mean value-free binary signal from an input signal (IN), said device (10, 40) comprising:

a limiter (3, 43) for generating a first binary signal from the input signal and a control signal (C, C4);

a first filter (8, 48) of substantially low pass characteristic, connected to the output of said limiter (3, 43) and generating a first filtered signal (S, S4);

a second filter (7, 47) of substantially low pass characteristic generating a second filtered signal (FJ, FJ4) by filtering a time mean value-free reference signal (J, J4), said control signal (C, C4) being generated from a difference signal between said first filtered signal (S, S4) and said second filtered signal (FJ, FJ4); and a regulator (9) connected via a first input to said first filter (8) and connected via a second input to said second filter (7), said regulator (9) generating said control signal (c) from said difference signal, said control signal being substantially proportional to the sum of said difference signal multiplied by a first constant and a second constant multiplied by the integral of said difference signal;

wherein said first filter (8, 48) and said second filter (7, 47) are substantially equal, and said time mean value-free binary signal of the device (OUT) consists of said first binary signal (O, O4).

11. The device of claim 10, wherein the value of said first constant is zero.

12. The device of claim 11, wherein the value of said second constant is zero.

13. The device of claim 10, further comprising a frequency divider (6, 46) connected to said second filter (7, 47) for generating said time mean value-free reference signal (J, J4) from a second binary signal with regular flanks.

14. The device of claim 13, wherein said second binary signal consists of said first binary signal (O, O4).

15. The device of claim 10, wherein the input signal (IN) is a data signal of substantially 50% probability of a high binary level.

16. The device of claim 10, wherein said regulator (9) comprises a difference signal former (9a) and a control signal former (9b), the output of said difference signal former (9a) being connected to the input of said control signal former (9b).

17. The device of claim 10, wherein the signal levels of said time mean value-free reference signal (J, J4) are substantially identical to the signal levels of said first binary signal (O, O4).

* * * * *